United States Patent [19]

Beinglass et al.

[11] Patent Number: 5,614,257
[45] Date of Patent: *Mar. 25, 1997

[54] LOW TEMPERATURE, HIGH PRESSURE SILICON DEPOSITION METHOD

[75] Inventors: Israel Beinglass, Sunnyvale; Mali Venkatesan, San Jose, both of Calif.

[73] Assignee: Applied Materials, Inc, Santa Clara, Calif.

[*] Notice: The term of this patent shall not extend beyond the expiration date of Pat. No. 5,607,724.

[21] Appl. No.: 444,146

[22] Filed: May 18, 1995

Related U.S. Application Data

[63] Continuation of Ser. No. 143,330, Oct. 26, 1993, abandoned, which is a continuation-in-part of Ser. No. 1,216, Jan. 6, 1993, abandoned, which is a continuation of Ser. No. 742,954, Aug. 9, 1991, abandoned.

[51] Int. Cl.$^6$ .................................................. C23C 16/00
[52] U.S. Cl. ..................... 427/248.1; 427/255.1; 427/255.2; 437/101; 148/DIG. 1
[58] Field of Search .................. 427/248.1, 255.1, 427/397.7, 255.2; 437/101; 148/DIG. 1

[56] References Cited

U.S. PATENT DOCUMENTS

| | | |
|---|---|---|
| 3,900,597 | 8/1975 | Chruma et al. . |
| 4,217,374 | 8/1980 | Ovshinsky et al. . |
| 4,237,150 | 12/1980 | Wiesmann ............................. 427/74 |
| 4,379,020 | 4/1983 | Glaeser et al. . |
| 4,404,236 | 9/1983 | Komatsu et al. . |
| 4,444,812 | 4/1984 | Gutsche . |
| 4,592,933 | 6/1986 | Meyerson et al. . |
| 4,634,605 | 1/1987 | Wiesmann . |
| 4,745,088 | 3/1988 | Inoue et al. . |
| 4,963,506 | 10/1990 | Liaw et al. . |
| 5,037,666 | 8/1991 | Mori . |

FOREIGN PATENT DOCUMENTS

| | | | |
|---|---|---|---|
| 54-4066 | 1/1979 | Japan .......................... | H01L 21/205 |
| 60-36662 | 2/1985 | Japan .......................... | C23C 16/24 |
| 63-239811 | 10/1985 | Japan . | |
| 63-3414 | 1/1988 | Japan . | |
| 63-258016 | 10/1988 | Japan .......................... | H01L 21/205 |
| 2-119223 | 5/1990 | Japan .......................... | H01L 21/304 |
| 2-122076 | 5/1990 | Japan .......................... | C23C 16/50 |
| 2-208293 | 8/1990 | Japan . | |

OTHER PUBLICATIONS

Morosanu, C.E., Thin Films by Chemical Vapor Deposition; Elsevier, 1990 p. 48.

Schuegraf, K.K. Handbook of Thin–Film Deposition Processes and Techniques; Noyes Publications, 1988, p. 81.

Thin Films by Chemical Vapor Deposition, Morosanu, Elsevier, 1990, p. 107.

Handbook of Thin Film Deposition Processes . . . , Schuegraf Noyes Publications, 1988, pp.80–81.

Advances in Deposition Processes for Passivation Films, Kern, J. Vac. Sci. Technol. vol. 14, No. 5, 1977, pp. 1082–1099.

J. Bloem, "High Chemical Vapour Deposition Rates of Epitaxial Silicon Layers:", J. Cryst. Growth, 18 (1973) pp. 70–76, North Holland Publishing Co.

W.A.P. Claasen et al, "The Deposition of Silicon from Silane in a Low–Pressure Hot–Wall System", J. Cryst. Growth 57 (1982) pp. 259–266, North Holland Publishing Co.

Primary Examiner—Roy V. King
Attorney, Agent, or Firm—Birgit E. Morris; Lawrence Edelman

[57] ABSTRACT

A method of producing amorphous silicon layers on a substrate by chemical vapor deposition at elevated pressures of at least about 25 Torr whereby deposition occurs at practicable rates. A substrate is loaded in a vacuum chamber, the temperature adjusted to obtain an amorphous silicon deposit of predetermined microcrystalline density, and the silicon precursor gases fed to the chamber to a preselected high pressure. Doped amorphous silicon films also can be deposited at high deposition rates. The above amorphous silicon films have a low density of nucleation sites; thus when the films are annealed, polycrystalline films having large crystal grains are produced.

8 Claims, 4 Drawing Sheets

LOW TEMPERATURE, HIGH PRESSURE SILICON DEPOSITION METHOD

CROSS REFERENCES TO RELATED APPLICATIONS

This is a continuation of U.S. application Ser. No. 08/143,330 filed Oct. 26, 1993, which is a continuation-in-part of U.S. application Ser. No. 08/001,216 filed Jan. 6, 1993, which is a continuation of Ser. No. 07/742,954 filed Aug. 9, 1991, all of them now abandoned.

This invention relates to a process for depositing undoped or doped silicon at high growth rates. More particularly, this invention relates to a process for depositing doped or undoped silicon in a single wafer chamber at practicable deposition rates.

BACKGROUND OF THE INVENTION

Conventional prior art doped or undoped silicon deposition has been carried out in accordance with a low pressure chemical vapor deposition process (LPCVD). A silicon precursor gas, such as silane, disilane, silicon tetrachloride and the like, which can also include a dopant gas such as phosphine, diborane or arsine, is fed to a chamber containing a substrate on which the silicon layer is to be deposited. The substrate is heated to deposition temperature and the gases fed to the chamber where they are decomposed, whereupon silicon deposits on the surface of the substrate.

These systems are typically run at pressures of about 200 to 400 millitorr; thus the low pressure designation. However, at these pressures the silicon deposition rate is very low, on the order of about 100 angstroms per minute for undoped silicon and only about 30–50 angstroms per minute for doped silicon. The prior art processes have compensated for the low deposition rates by loading a plurality, e.g., up to about 100, of substrates at a time in a chamber to be processed.

In the prior art LPCVD system illustrated in FIG. 1, a chamber 10 includes a boat 11 carrying a plurality of silicon wafers 12. A gas feed from a gas source 13 is controlled by a flow controller 14 and enters the chamber 10 from gas inlet port 15. The gas feed is maintained across the wafers 12 in the direction of the arrows. The low pressure in the chamber 10 is maintained by an exhaust system 16. Because the concentration of the feed gases can decrease as they flow toward the exhaust system 16, the chamber also includes three separately controlled heater elements 17 that provide temperature variations in the chamber 10 to compensate for the variation of concentrations of reactant gases within the chamber 10.

FIG. 2 illustrates another prior art LPCVD batch-type silicon deposition chamber. In this chamber, a plurality of wafers 21 are stacked vertically and the reactant gases are injected through a plurality of holes 23 in a gas injector 22. The gas injector 22 is located between two rows of wafers 21. The low pressure in this chamber again enables sufficient uniformity of deposition that the deposition can be performed in a batch type process.

While careful adjustment of the gas pressures and temperatures can deposit smooth, uniform silicon films onto a substrate in this manner, the disadvantage is that if anything goes wrong during the deposition, e.g., a power outage, impurities in the feed gases or the like, a large batch of wafers is damaged and rendered useless.

Further, more modern semiconductor processing equipment employs multiple chambers for the multiple process steps of preparing devices onto substrates such as silicon, gallium arsenide and the like. Several processes are sequentially performed on a single wafer at one time in a series of interconnected chambers, all under vacuum. This eliminates the need to ramp pressures up and down between process steps which is both costly and exposes the substrates to contaminants in the ambient.

However, since the deposition of silicon in a LPCVD process is slow, the time required for depositing a layer of silicon onto one wafer at a time is unduly long and adds greatly to the costs of producing devices. Further, the silicon deposition step would be a bottleneck in multiple stage process equipment.

Still further, thin film transistors made from amorphous silicon are of increasing interest to the semiconductor industry. Amorphous silicon films used to make thin film transistors desirably contain a minimum number of nucleation sites for grain growth during subsequent annealing steps. This is because when making transistors from amorphous silicon, it is desired that the deposited silicon film imitate crystalline silicon as much as possible; the presence of fewer nucleation sites in the deposited amorphous silicon results in fewer and larger crystal grains in the annealed silicon films, since the grains grow during annealing until they meet an adjacent crystal grain. Thus the fewer the number of nucleation sites present, the larger the grains become during subsequent annealing. When making transistors in such thin films, the larger the grain size, the greater the chance that any one transistor will be built upon a single grain or single crystal.

Thus a process that would improve the throughput of silicon deposition onto single substrates in a multiple stage reactor, and reduce the number of nucleation sites in amorphous silicon thin films, would be highly desirable.

SUMMARY OF THE INVENTION

We have found that the rate of deposition of doped and undoped amorphous silicon can be greatly increased by increasing the pressure within a single substrate CVD chamber. Deposition rates up to about 3000 angstroms per minute can be achieved at a gas pressure of over about 25 Torr.

By proper choice of deposition temperature, the deposited films are amorphous silicon layers that can vary in microcrystalline density. Amorphous silicon layers can be deposited according to the invention that are useful in the manufacture of thin film transistors. By depositing silicon at low temperatures, from about 500° C. and up to about 600° C., and at high pressures of about 25 Torr or higher, amorphous silicon films having very few nucleation sites are obtained. Nucleation of these films by heating at about 600° C. for extended periods produce a polycrystalline silicon film having large crystal grains. This is advantageous because, at least locally, large grain size resembles a crystalline silicon film.

DETAILED DESCRIPTION OF THE INVENTION

In accordance with the present invention, a single substrate is loaded into a chamber of a multiple chamber reactor, the temperature of the substrate is adjusted to the desired deposition temperature, and deposition gases are fed to the chamber at the desired high pressure for the desired period to deposit amorphous silicon to a predetermined thickness.

In order to increase the deposition rate of amorphous silicon, the pressure in the chamber must be maintained at from at least about 25 Torr, and preferably from about 25 to about 150 Torr. Deposition rates of up to about 3000 angstroms per minute of silicon can be achieved at these pressures, even at comparatively low temperatures. At lower pressures and temperatures the deposition rate drops, so these parameters are adjusted in accordance with the invention to obtain a commercially practicable rate of deposition of amorphous silicon. In single wafer deposition chambers for silicon wafers, above about 350 Torr pressure, a significant amount of deposition will occur on the walls and other fixtures of the reaction chamber and particulates that can contaminate the substrates can also be formed, which is undesirable. The unexpectedly large increase in deposition rate in accordance with the invention enables single substrate processing at time periods that remain competitive with multiple substrate batch processing. Since deposits of amorphous silicon for thin film transistors require only thin films of 1000 angstroms or less, even if the deposition rate is fairly low, the time required for the deposition remains satisfactory.

This process is economical to deposit amorphous silicon layers. Amorphous silicon thin films can be deposited using silane, disilane, silicon tetrachloride, silicon trichloride, silicon dichloride and the like as the silicon precursur gas, generally together with a carrier gas such as nitrogen or hydrogen. The exact crystallographic nature of the silicon deposited depends upon the temperature of deposition. For example, at low deposition temperatures of about 500°–630° C., the silicon deposited is mostly amorphous. At somewhat higher temperatures of about 630°–670° C. a mixture of amorphous and polysilicon will be obtained. At still higher temperatures of about 670°–700° C. the deposited silicon will be polycrystalline silicon.

Figure 3:
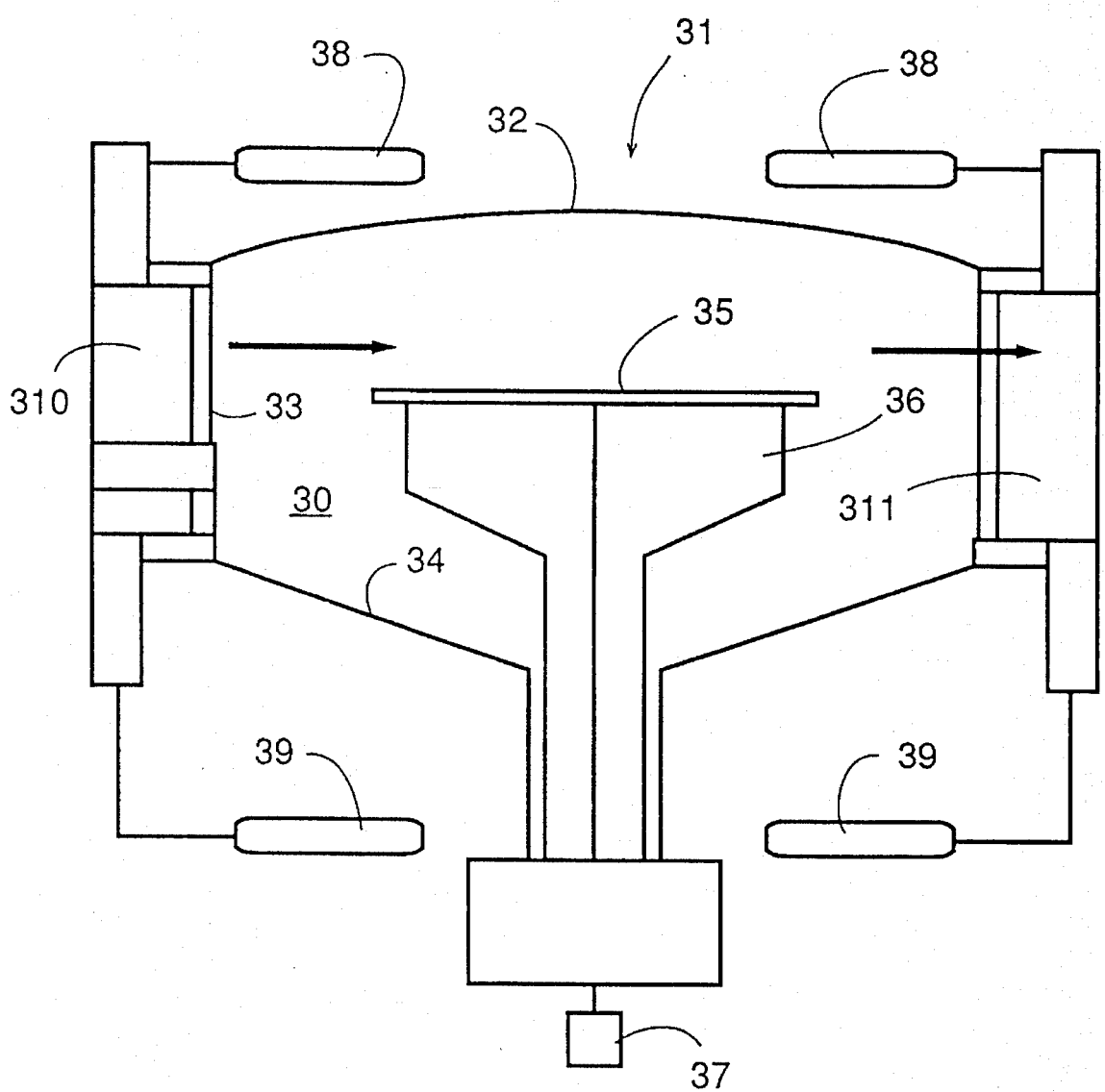
FIG. 3 illustrates a single wafer reactor in which silicon is deposited on wafers at high pressures in accordance with the invention.

The present process will be further described by reference to FIG. 3. FIG. 3 illustrates a single substrate reactor 31 in which either doped or undoped silicon layers can be deposited at commercially attractive rates. This reactor has a top wall 32, side walls 33 and a bottom wall 34 that define a reaction chamber 30 into which a single substrate 35, such as a wafer, can be loaded. The substrate 35 is mounted on a pedestal 36 that is rotated by a motor 37 to provide a time averaged environment for the substrate that is cylindrically symmetric. The substrate 35 is heated by light from high intensity lamps 38 and 39. The top wall 32 and the bottom wall 34 should be substantially transparent to light to enable the light from the lamps 38 and 39 to enter the chamber 30. Quartz is a particularly useful choice for the top and bottom walls 32 and 34 because it is transparent to light at visible and uv frequencies, it is a relatively high strength material that can support a large pressure difference across these walls, and it has a low rate of outgassing.

Reactant gases flow from a gas input port 310 and across the wafer 35 to an exhaust port 311. The gas input port 310 is connected to a gas manifold that provides one or a mixture of gases to enter via a plurality of pipes into this slot. The locations of the input ends of these pipes, the gas concentrations and/or flow rate through each of these pipes are selected to produce reactant gas flow and concentration profiles that optimize processing uniformity. Although the rotation of the substrate and thermal gradients caused by the heat from lamps 38 and 39 can significantly affect the flow profile of gases in the reaction chamber 30, the dominant shape of the flow profile is laminar flow from the gas input port and across the substrate to the exhaust port 311.

In a typical process producing a silicon layer on a silicon wafer, a pressure of 80 Torr in a vacuum chamber was maintained by feeding hydrogen at about 10 liters per minute into the chamber and adding about 525 sccm of silane after the temperature of the wafer reached 650° C. Under these conditions a mixture of about 50:50 polycrystalline and amorphous silicon was deposited at a rate of 2000 angstroms per minute.

At a higher wafer temperature of about 690° C. using about 250 sccm of silane, the deposited silicon was polycrystalline silicon.

Phosphorus doped polycrystalline silicon was deposited onto a wafer in the chamber of FIG. 3 by feeding a mixture of 525 sccm of silane and 300 sccm of 1% phosphine in hydrogen at a temperature of 650° C. The resultant silicon layer contained about $1.5 \times 10^{21}$ cm$^{-3}$ of phosphorus and was deposited at a rate of about 1500 angstroms per minute.

Low temperature deposition of amorphous silicon at practicable deposition rates can also be obtained by the present high pressure deposition process.

Figure 4:
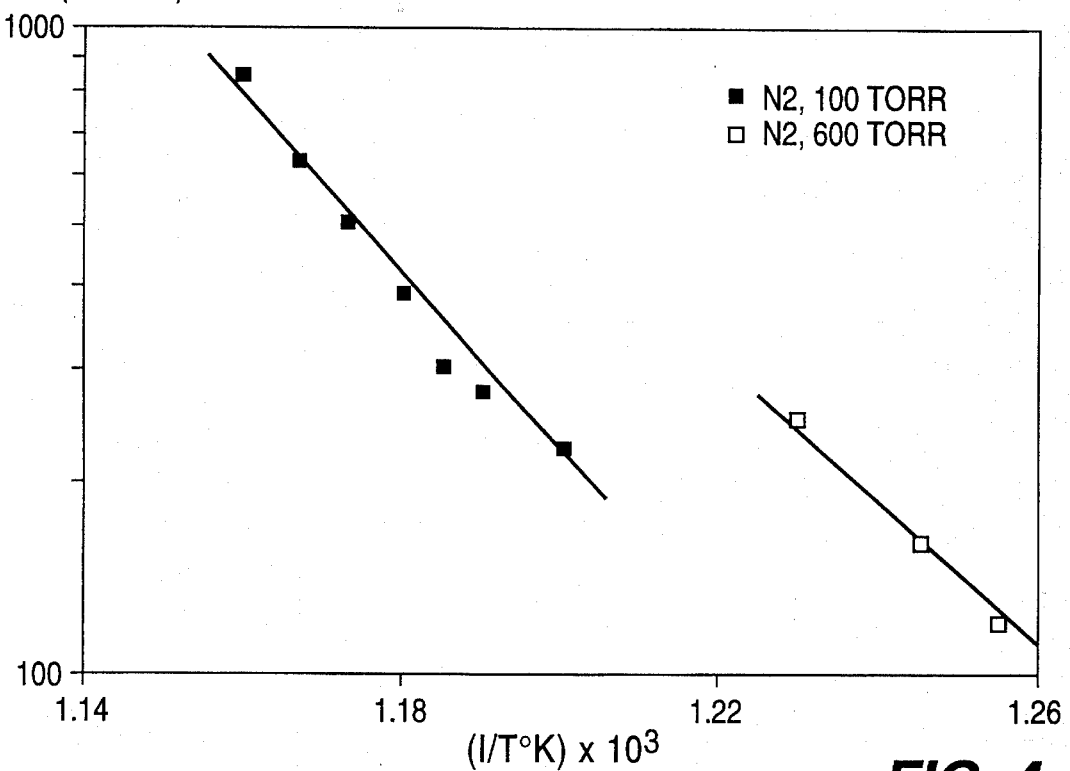
FIG. 4 is a graph illustration the change in deposition rates of amorphous silicon with temperature.

FIG. 4 is a graph illustrating deposition rates at pressures of both 100 Torr and 600 Torr at varying temperature using a gas flow of silane and nitrogen as the carrier gas. This graph confirms that the lower the temperature, the lower the deposition rate. However, even at very low temperatures of about 520°–560° C., deposition rates of several hundred angstroms per minute can be achieved if the pressure is high enough (600 Torr). A preferred temperature range is from about 520°–590° C.

Figure 5:
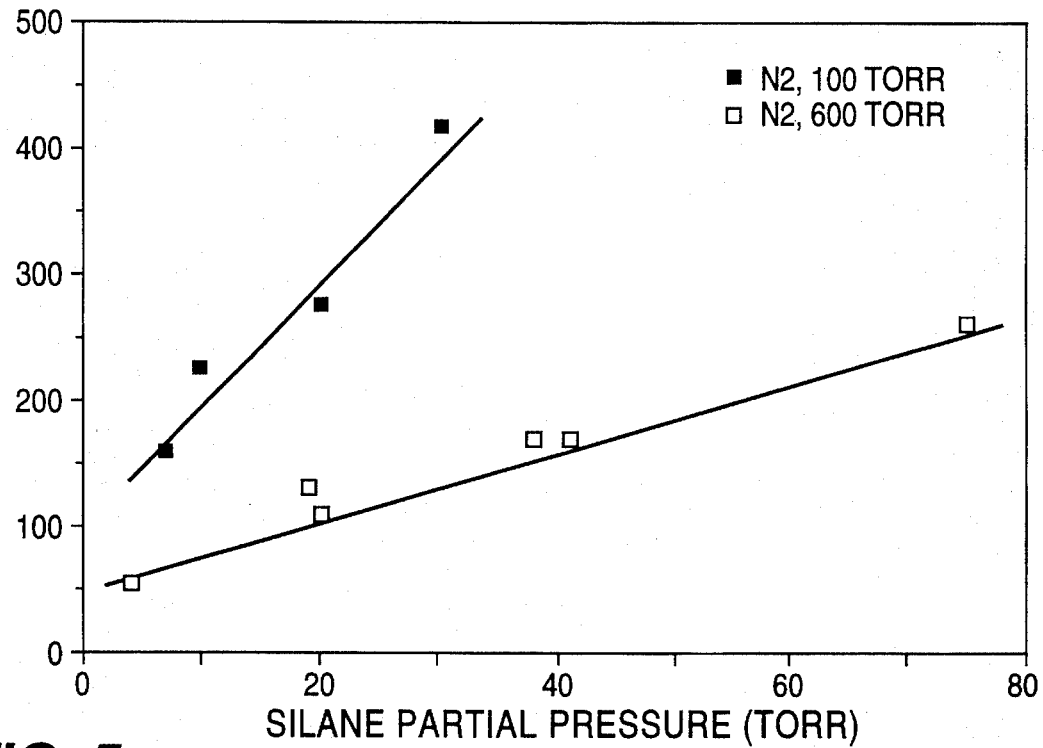
FIG. 5 is a graph illustrating the change in deposition rates with pressure at a fixed temperature.

FIG. 5 is a graph illustrating the change in deposition rate with pressure using silane and either hydrogen or nitrogen as the carrier gas at a deposition temperature of 560° C. It is apparent that the deposition rate increases at increased pressures. The use of nitrogen carrier gas instead of hydrogen is also advantageous as far as deposition rate is concerned.

Figure 6:
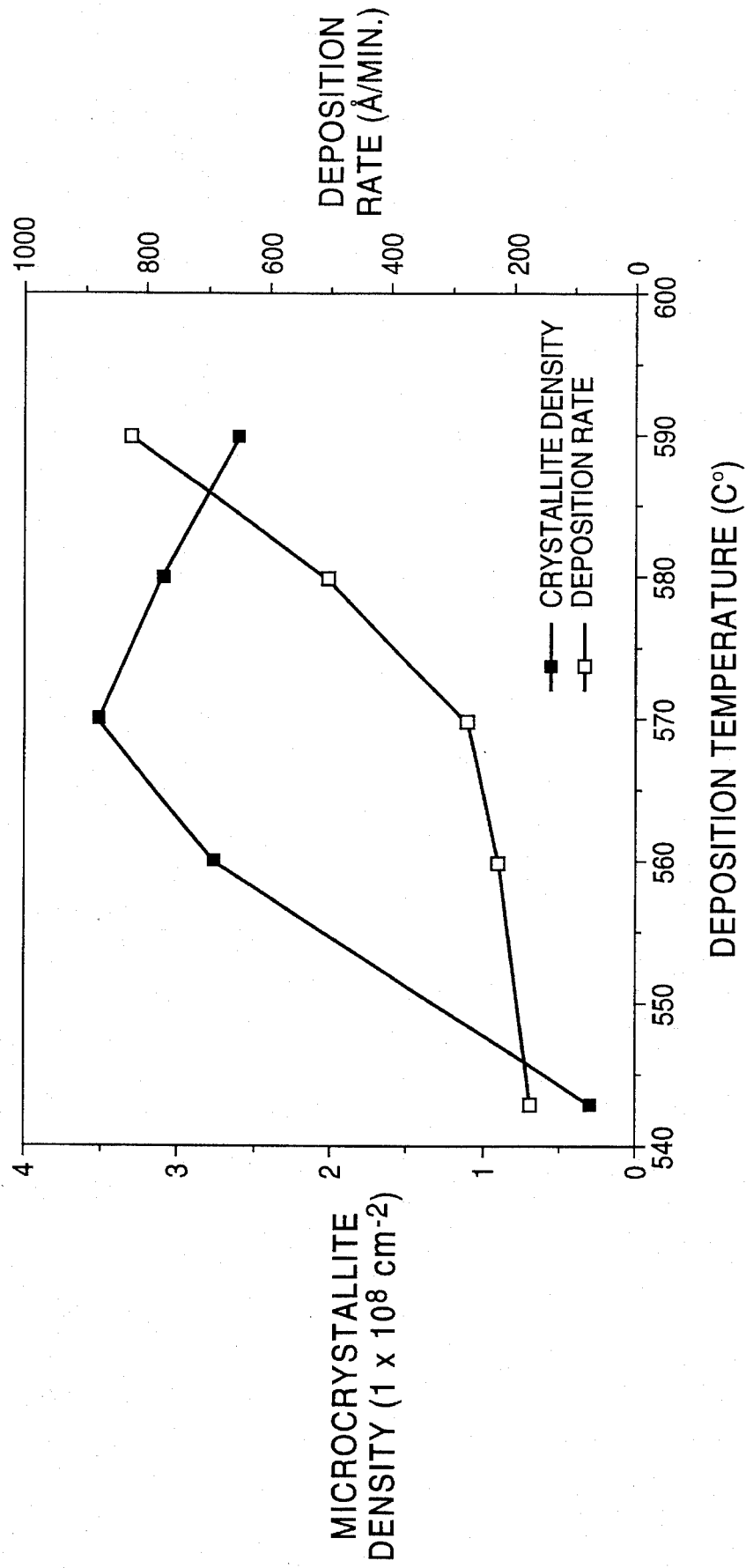
FIG. 6 is a graph illustrating the microcrystalline density variation in amorphous silicon films with change in deposition temperature.

FIG. 6 is a graph illustrating microcrystalline density variation with temperature of deposition of amorphous silicon films. There is a maximum number of microcrystals at a deposition temperature of about 570° C.; thus to deposit an amorphous silicon film having a low microcrystalline density, either a lower or higher deposition temperature range should be employed. The use of a lower temperature range, such as 520°–560° C., reduces the microcrystalline density of the amorphous silicon films, but the deposition rate is quite low. Deposition at a higher temperature range of about 580°–590° C. produces an amorphous silicon film with low, but somewhat higher microcrystalline density, but a faster deposition rate. In any event, by adjusting the temperature and pressure of deposition, the microcrystalline density and deposition rate can be chosen to optimize the amorphous silicon films for particular end uses.

The above amorphous silicon films, having a low density of nucleation sites, when annealed at crystallization temperatures of about 600° C. and higher, produce polycrystalline films having large grain size.

Figure 1:
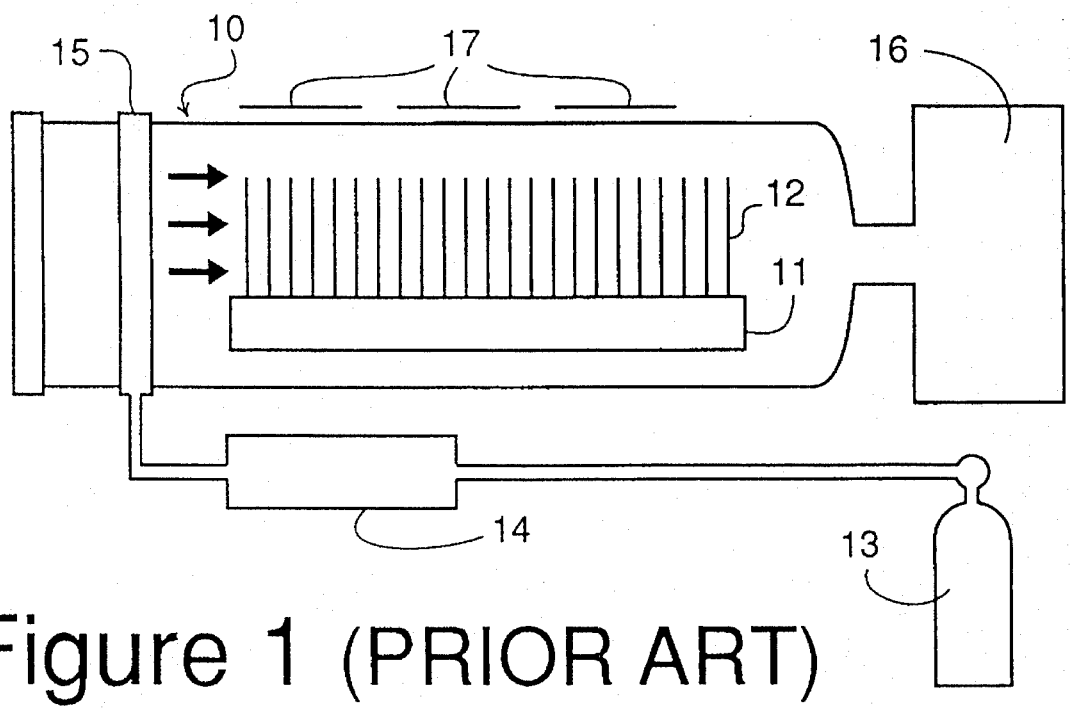
FIG. 1 illustrates a conventional LPCVD reactor utilized to deposit doped and undoped silicon layers on a batch of wafers.
Figure 2:
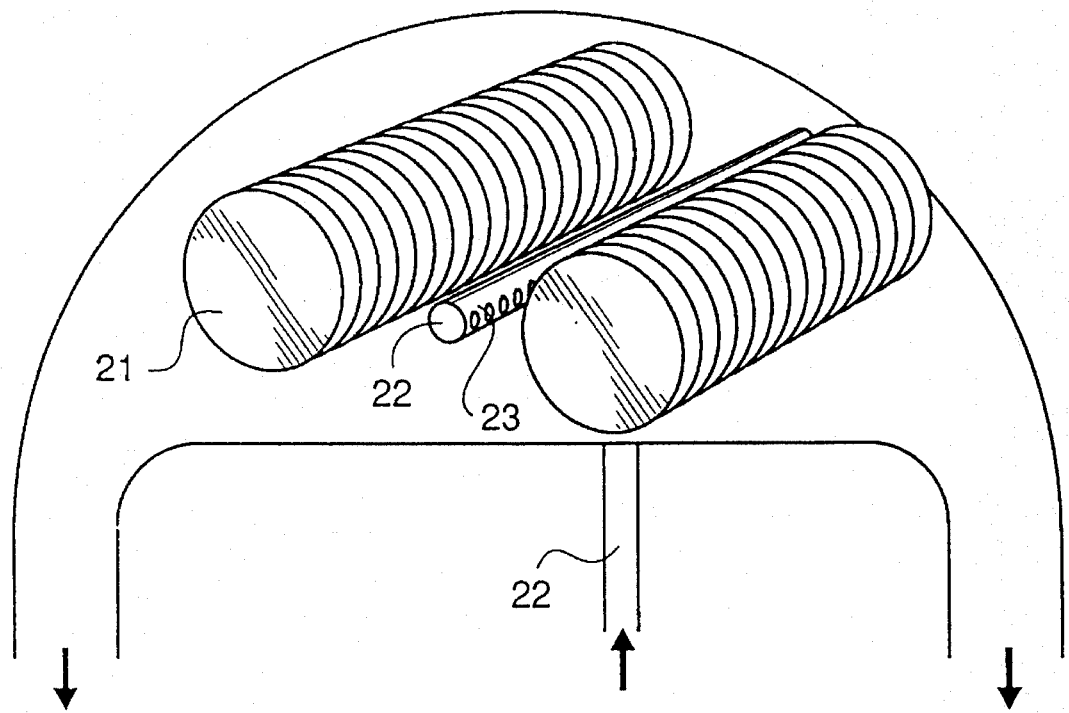
FIG. 2 illustrates another existing LPCVD reactor utilized to deposit doped and undoped silicon layers on a batch of wafers.

Doped amorphous silicon layers can also be produced by CVD, but generally at lower rates of deposition. Further, the prior art LPCVD deposition processes performed in the apparatus of FIGS. 1 and 2 produce films of nonuniform thickness. The feed gases are adjusted to admix an appropriate amount of dopant gas in addition to the silicon precursor gas. For example, small amounts of phosphine can be added to produce phosphorus-doped silicon; small amounts of diborane can be added to produce boron-doped silicon; and small amounts of arsine can be added to produce arsenic-doped silicon.

Although the invention has been described with reference to particular pressures, temperature and reaction chamber type, one skilled in the art will recognize that other pressures, temperatures, gas feedstocks and deposition chambers can be substituted and are meant to be included herein. The invention is only meant to be limited by the appended claims.

We claim:

1. A thermal chemical vapor deposition method of depositing amorphous silicon on a substrate which comprises:

a) loading a substrate into a single substrate chemical vapor deposition vacuum chamber fitted with means for temperature and pressure control;

b) controlling the temperature of deposition below about 600° C.;

c) adding a silane selected from the group consisting of monosilane and disilane as a silicon precursor gas to the chamber; and d) maintaining a high pressure in the chamber of at least about 25 Torr until an amorphous silicon film is deposited on the substrate.

2. A method according to claim 1 wherein the temperature of deposition is at least about 500° C. and below about 600° C.

3. A method according to claim 1 wherein the silicon precursor gas is mixed with a carrier gas.

4. A method according to claim 3 wherein said carrier gas is nitrogen.

5. A method according to claim 3 wherein said carrier gas is hydrogen.

6. A method according to claim 1 wherein said silicon precursor gas is monosilane.

7. A method according to claim 1 wherein the temperature of deposition is maintained between about 520°–590° C.

8. A method according to claim 1 wherein the pressure is maintained in the range of 25–150 Torr.

* * * * *